United States Patent [19]

Hawkey

[11] Patent Number: 4,651,021

[45] Date of Patent: Mar. 17, 1987

[54] PULSER CIRCUIT

[76] Inventor: Dale F. Hawkey, 13532 - 110th Street, Edmonton, Alberta, Canada, T5E 4Z2

[21] Appl. No.: 762,434

[22] Filed: Aug. 5, 1985

[51] Int. Cl.$^4$ .............................................. H03K 3/00
[52] U.S. Cl. ................................... 307/106; 307/108; 307/243; 328/67
[58] Field of Search ........... 307/106, 108, 107, 132 R, 307/96, 97, 243, 283; 73/622, 637, 638, 642; 375/3; 328/67

[56] References Cited

U.S. PATENT DOCUMENTS

| | | | |
|---|---|---|---|
| 3,524,071 | 8/1970 | Kintzinger et al. | 307/106 |
| 4,001,598 | 1/1977 | Johannessen | 307/106 |
| 4,135,122 | 1/1979 | Holmquist et al. | 307/106 X |
| 4,367,415 | 1/1983 | Brünner | 307/106 |
| 4,442,362 | 4/1984 | Rao | 307/108 |
| 4,475,399 | 10/1984 | Livingston | 73/637 X |
| 4,487,072 | 12/1984 | Livingston | 73/622 |
| 4,494,011 | 1/1985 | Davis | 307/106 |
| 4,541,064 | 9/1985 | Livingston | 73/637 X |
| 4,559,825 | 12/1985 | Martens | 73/622 |
| 4,577,166 | 3/1986 | Milberger et al. | 307/106 X |

Primary Examiner—William M. Shoop, Jr.
Assistant Examiner—Sharon D. Logan

[57] ABSTRACT

A pulser circuit comprises a transistor with its drain and source arranged in parallel with a first resistor, and two SCR's each arranged in parallel with a further resistor. These elements are arranged as a series circuit across a capacitor, and a supply terminal is connected to the capacitor for charging the same. The gate of the transistor can be triggered to short circuit the first resistor and hence increase the forward voltage across each SCR. This increased voltage causes breakover of the SCR's and hence discharge of the capacitor through the series circuit of the SCR's and the transistor in avalanche mode, until the voltage drops sufficiently to permit recovery of the SCR's and recharging of the capacitor in readiness for further triggering. The result is a pulse at a circuit point between the capacitor and the series connection. This pulse has the desirable attributes of a relatively high voltage and short duration. Moreover the recovery time of the circuit permits a high repetition rate. Pulses of this type are useful for energizing transducers of ultrasonic testing equipment.

8 Claims, 2 Drawing Figures

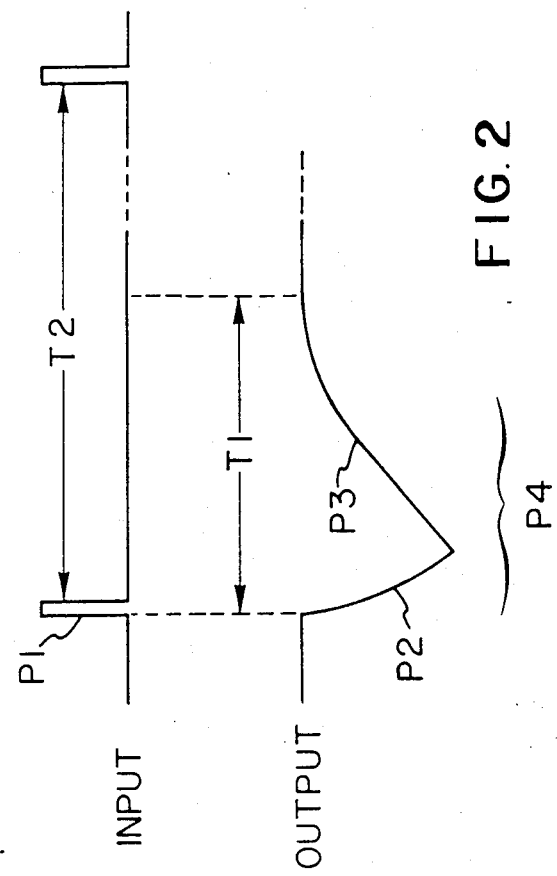

PULSER CIRCUIT

BACKGROUND OF THE INVENTION

This invention relates to a pulser circuit designed to generate a relatively high voltage, e.g. 300 volts, short pulse, e.g. 200 ns, with the capability of a high repetition rate, e.g. 50 kHz or more.

A pulser circuit according to the present invention has been developed for use in pulsing the transducers used in ultrasonic testing equipment, in which the pulse criteria mentioned above apply, but the invention is not limited to this particular use and can be used for any purpose where a rapidly repeating series of short, relatively high voltage pulses is required.

PRIOR ART

It is common in ultrasonic testing equipment to employ transducers to transmit sound waves to, and receive either reflected or transmitted sound waves back from, various parts of a workpiece to be examined for flaws. Especially if the workpiece is large and/or is moving, a bank of transducers may be used, since each transducer, or pair or group of transducers, can only effectively detect flaws in a limited area of the workpiece. When such a bank of transducers is used, they will typically be sequentially energised, either singly or in pairs or groups, by a pulser circuit. This is known as ultrasonic multiplexing.

However, the pulser circuits that have hitherto been available for this purpose have proved incapable of generating a sufficiently high repetition rate to ensure that a large or fast moving workpiece will always be adequately examined in the time available.

SUMMARY OF THE INVENTION

An object of the present invention is to provide an improved pulser circuit that is capable of furnishing a rapidly repeating series of pulses of a type suitable for use in pulsing transducers of the type employed in ultrasonic testing equipment, although not necessarily restricted to this use.

Transducers of the type used in ultrasonic testing equipment require a relatively high voltage pulse for effective operation. By "relatively high voltage," reference is made to at least 200 volts, and preferably 300 volts or more. Moreover, such transducers require a short or high frequency pulse.

It is a more specific object of the present invention to provide a pulser circuit for generating a short pulse, e.g. a pulse length of 200 ns, which is equivalent to 5.0 MHz except that in the present invention only a single spike (in contrast to a train of oscillations) is provided each time a particular transducer or group of transducers is to be energised.

To achieve this end, the present invention, in its broadest scope, consists of a pulser circuit comprising a first subcircuit consisting of the drain and source of a transistor and a first resistor arranged in parallel with each other, and at least one further subcircuit each consisting of an SCR and a further resistor arranged in parallel with each other. The subcircuits are connected in series with each other across a capacitor and a supply terminal is connected to the capacitor for charging it. An input terminal is connected to the gate of the transistor for triggering it. When so triggered to the ON state, the transistor short circuits the first resistor to increase the forward voltage across each of the SCR's to cause breakover of the same and hence discharge of the capacitor through the SCR or SCR's and through the transistor in avalanche mode until the voltage drops sufficiently to permit recovery of the SCR or SCR's and recharging of the capacitor in readiness for further triggering. The result is to generate a short pulse at a circuit point located between the capacitor and the series connection of subcircuits.

In the preferred embodiment of the invention there are three subcircuits, i.e. one transistor subcircuit and two SCR subcircuits. This use of three subcircuits enables the supply voltage (and hence the voltage of the output pulse) to be of the order of 300 volts, on the basis that a typical SCR will block a forward voltage of 100 volts (the 300 supply volts being divided by the three resistors equally across the two SCR's and the transistor) but will conduct in breakover at 150 volts (the 300 supply volts being divided equally between the two SCR's by their parallel resistors when the transistor conducts).

BRIEF DESCRIPTION OF DRAWINGS

FIG. 2 is a pulse diagram.

DETAILED DESCRIPTION OF THE PREFERRED EMBODIMENT

Figure 1:
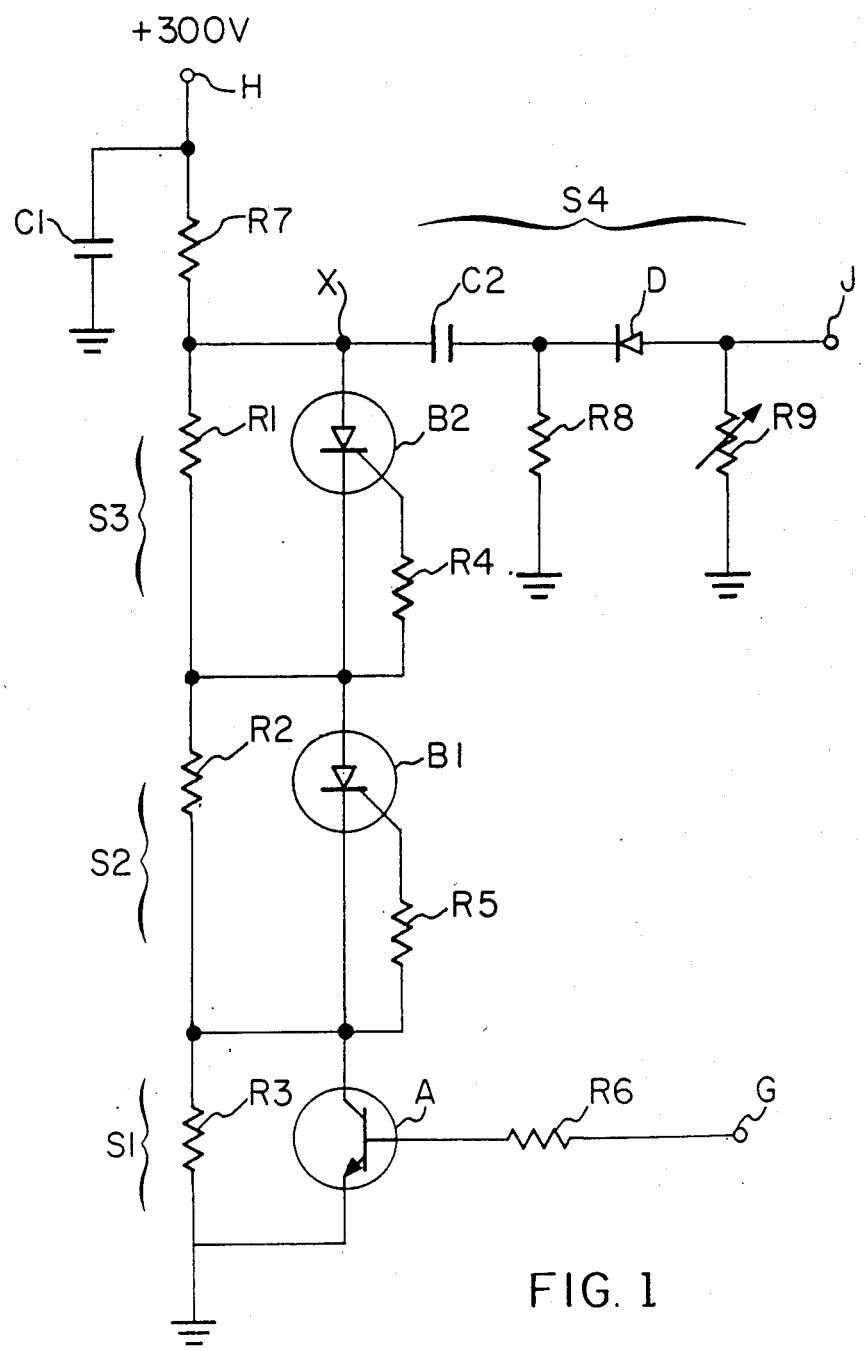
FIG. 1 shows an embodiment of the invention.

The circuit of FIG. 1 consists of a transistor A and two semiconductor controlled rectifiers (SCR's) B1 and B2 arranged in series between ground and a circuit point X. A parallel circuit of three resistors R1, R2 and R3 extends from the point X to ground, with the intermediate points between the resistors being connected to intermediate points E and F between the transistor and the SCR's. This arrangement can be viewed as a first subcircuit S1 consisting of the drain and source of the transistor A in parallel with the resistor R3; a second subcircuit S2 consisting of the SCR B1 in parallel with the resistor R2; and a third subcircuit S3 consisting of the SCR B2 in parallel with the resistor R1.

The resistors R1, R2 and R3 will have relatively high resistances, e.g. 10 megohms each. The intermediate points E and F are connected to the respective gates of SCR's B1 and B2 through resistors R4 and R5 each having a low resistance, e.g. 100 ohms. The gate of the transistor A is connected through resistor R6 having a low resistance, e.g. 100 ohms, to an input triggering terminal G.

The circuit point X is connected through a resistor R7 of relatively low resistance (e.g. 10 kilohms) compared to the resistors R1–R3, but having a comparatively large wattage capacity, to a +300 V supply on terminal H, and also to one side of a storage capacitor C1 the other side of which is grounded. Point X is also connected to an output terminal J through a capacitor C2 and a diode D, the circuit point between the capacitor C2 and the diode D having a connection to ground through a resistor R8, e.g. 220 ohms, and the output terminal J having a connection to ground through a variable resistor R9, e.g. 1 kilohm maximum and about 50 ohms minimum. The output terminal J is assumed to be connected to one or more ultrasonic transducers (not shown).

Hence the three subcircuits S1–S3 are connected in series with each other across the capacitor C1 which is charged from the supply H, and a fourth, output subcircuit S4, comprising the shaping and polarity ensuring components C2, D, R8 and R9, is connected between circuit point X and the output terminal J.

In operation, a triggerng pulse P1 (FIG. 2) is supplied from a sequencer (not shown) to the input terminal G to turn on the transistor A. Prior to this triggering action, the 300 volts from the supply terminal H had been divided equally across resistors R1 to R3 (since the resistance of the resistor R7 is much smaller and can be ignored for this purpose), so that there was approximately 100 volts across each of the SCR's B1 and B2, and they were both in the forward blocking condition. When the transistor A conducts, the resistor R3 is short circuited and the voltage at the point F falls virtually to ground, so that there is now 150 volts across each SCR, which is enough to cause forward breakover to occur. Consequently both the SCR's B1 and B2 conduct and the transistor A conducts in avalanche mode to discharge capacitor C1 through this series circuit and hence cause the voltage at point X to fall very rapidly from +300 volts virtually to ground. This is the equivalent of a sharp negative excursion P2 which can be as short as 20 ns.

When the forward voltage across each of the SCR's reaches a few volts these devices will switch back to the blocking state and recovery of the positive voltage at the point X will begin (P3 in FIG. 2). The resulting overall pulse P4 will last for approximately a time T1 which could typically be about 200 ns, and the circuit will then be fully ready to be triggered again by the pulse P1. For a pulse repetition rate of 50 kHz, for example, the time T2 between adjacent triggering pulses P1 would be required to be 20,000 ns. Hence the circuit is capable of at least this repetition rate and a much faster one, if required. This inherently high speed of the circuit is believed to flow from the feature of switching on the SCR's by breakover triggering rather than by gate triggering.

For each of the SCR's the respective resistors R4 and R5 divert some of the thermally generated leakage current and the dv/dt induced capacitative charging current around the gate cathode junction, by providing an alternative lower impedance path to the cathode. As a result, regeneration is reduced and superior high temperature characteristics and dv/dt capability are attained.

The capacitor C2 isolates the output terminal J from the direct voltage and controls the speed of the pulses that can be passed through. The diode D ensures that only negative pulses pass to the output terminal J. The resistors R8 and R9 cooperate with the capacitor C2 to modify the shape and width of the pulses, as may be required by the design of the transducers that the pulses energise. As a result the final output at the terminal J may be a smoothed and elongated version of the pulse P4 shown in FIG. 2.

While in the example two SCR's are employed, a single SCR can be used if either a lower voltage output pulse, e.g. 200 volts were needed, or an SCR that could provide forward blocking for substantially more than 100 volts, say 150 volts, were available, or more than a third of the initial voltage drop of 300 volts could be tolerated across the transistor. Conversely, more than two SCR's in the series chain could be used, for example if the pulse voltage were to be still higher, e.g. 400 volts.

The order of the arrangement of the subcircuit's S1, S2 and S3 is not important. The incoming trigger signal terminal G must always be connected to the transistor base, but this transistor could be situated between the two SCR's or at the top of the chain of subcircuits, i.e. adjacent the point X.

I claim:
1. A pulser circuit comprising
    (a) a first subcircuit consisting of a transistor having a drain and a source, and a first resistor connected at one end to the drain and at the other end to the source,
    (b) a second subcircuit consisting of an SCR and a second resistor arranged in parallel with the SCR,
    (c) a capacitor,
    (d) means forming a series circuit by connecting the first subcircuit in series with the second subcircuit,
    (e) means connecting said series circuit across the capacitor,
    (f) a supply terminal connected to the capacitor for charging the same, and
    (g) an input terminal connected to the gate of the transistor for triggering the same to short circuit the first resistor and hence increase the forward voltage across the SCR to cause breakover of the same and discharge of the capacitor through the SCR and the transistor in avalanche mode until recovery of the SCR whereupon to recharge the capacitor in readiness for further triggering, and to generate a short pulse at a circuit point between the capacitor and said series circuit.

2. A pulser circuit according to claim 1 including a third subcircuit connected in series with the first and second subcircuits in said series circuit, said third subcircuit consisting of a second SCR and a third resistor in parallel with the second SCR.

3. A pulser circuit according to claim 2 wherein the SCR of each of the second and third subcircuits has a low resistance connection between its gate and its cathode.

4. A pulser circuit according to claim 3, wherein the supply terminal is connected to a supply of at least about +300 volts.

5. A pulser circuit according to claim 3, wherein said short pulse is about 200 ns long.

6. A pulser circuit according to claim 3, wherein said first, second and third resistors have resistance values substantially equal to each other.

7. A pulser circuit according to claim 6, including a fourth resistor connected between the capacitor and said series circuit, the resistance value of the fourth resistor being low compared to that of said first, second and third resistors.

8. A pulser circuit according to claim 7, including an output subcircuit consisting of a further capacitor, a diode and additional resistors for passing the generated short pulse to an output terminal while shaping and ensuring the polarity of said short pulse.

* * * * *